(12) United States Patent
Kronholz et al.

(10) Patent No.: US 8,486,786 B2
(45) Date of Patent: Jul. 16, 2013

(54) ENHANCING UNIFORMITY OF A CHANNEL SEMICONDUCTOR ALLOY BY FORMING STI STRUCTURES AFTER THE GROWTH PROCESS

(75) Inventors: Stephan Kronholz, Dresden (DE); Martin Trentzsch, Dresden (DE); Richard Carter, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 457 days.

(21) Appl. No.: 12/776,512

(22) Filed: May 10, 2010

(65) Prior Publication Data

US 2010/0289090 A1 Nov. 18, 2010

(30) Foreign Application Priority Data

May 15, 2009 (DE) .................. 10 2009 021 484

(51) Int. Cl.
*H01L 27/088* (2006.01)
*H01L 21/8236* (2006.01)

(52) U.S. Cl.
USPC .............. 438/275; 257/392; 257/E21.631; 257/E27.061

(58) Field of Classification Search
USPC .... 257/392, E21.631, E27.061; 438/270–278
See application file for complete search history.

(56) References Cited

U.S. PATENT DOCUMENTS

| | | | |
|---|---|---|---|
| 7,199,017 B2 | 4/2007 | Gonzalez et al. | 438/404 |
| 2001/0003364 A1 | 6/2001 | Sugawara et al. | 257/192 |
| 2005/0233531 A1* | 10/2005 | Kwak | 438/289 |
| 2006/0105533 A1 | 5/2006 | Chong et al. | 438/322 |
| 2008/0079086 A1 | 4/2008 | Jung et al. | 257/369 |
| 2008/0227250 A1 | 9/2008 | Ranade et al. | 438/203 |
| 2010/0193881 A1 | 8/2010 | Kronholz et al. | 257/402 |

FOREIGN PATENT DOCUMENTS
DE 102009006886 A1 8/2010

OTHER PUBLICATIONS

Translation of Official Communication from German Patent Office for German Patent Application No. 10 2009 021 484.4-33 dated Oct. 25, 2010.
Isheden et al., "pMOSFETs with recessed and selectively regrown $Si_{1-x}Ge_x$ source/drain junctions," *Materials Science in Semiconductor Processing*, 8:359-62, 2005.
Widmann et al., Technologie hochintegrierter Schaltungen, $2^{nd}$ edition, Berlin, Springer 1996, pp. 66-67 and 335-340.
Translation of Official Communication from German Patent Office for German Patent Application No. 10 2009 021 484.4-33 dated Feb. 2, 2010.

* cited by examiner

*Primary Examiner* — Mamadou Diallo
(74) *Attorney, Agent, or Firm* — Williams, Morgan & Amerson, P.C.

(57) ABSTRACT

When forming sophisticated gate electrode structures of transistor elements of different type, the threshold adjusting channel semiconductor alloy may be provided prior to forming isolation structures, thereby achieving superior uniformity of the threshold adjusting material. Consequently, threshold variability on a local and global scale of P-channel transistors may be significantly reduced.

24 Claims, 8 Drawing Sheets

ENHANCING UNIFORMITY OF A CHANNEL SEMICONDUCTOR ALLOY BY FORMING STI STRUCTURES AFTER THE GROWTH PROCESS

BACKGROUND OF THE INVENTION

1. Field of the Invention

Generally, the present disclosure relates to sophisticated integrated circuits including advanced transistor elements that comprise highly capacitive gate structures including a metal-containing electrode and a high-k gate dielectric of increased permittivity.

2. Description of the Related Art

The fabrication of advanced integrated circuits, such as CPUs, storage devices, ASICs (application specific integrated circuits) and the like, requires a large number of circuit elements to be formed on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions.

In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity and reduction of gate resistivity, is a dominant design criterion for accomplishing an increase in the operating speed of the integrated circuits.

Presently, the vast majority of integrated circuits are fabricated on the basis of silicon, due to the substantially unlimited availability thereof, the well-understood characteristics of silicon and related materials and processes and the experience gathered over the last 50 years. Therefore, silicon will likely remain the material of choice in the foreseeable future for circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes as are required, for example, for anneal cycles to activate dopants and to cure crystal damage without sacrificing the electrical characteristics of the interface.

For the reasons pointed out above, in field effect transistors, silicon dioxide is preferably used as a gate insulation layer that separates the gate electrode, frequently comprised of polysilicon or other metal-containing materials, from the silicon channel region. In steadily improving device performance of field effect transistors, the length of the channel region has been continuously decreased to improve switching speed and drive current capability. Since the transistor performance is controlled by the voltage supplied to the gate electrode, to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a pronounced dependence of the threshold voltage on the channel length. Aggressively scaled transistor devices with a relatively low supply voltage and thus reduced threshold voltage may suffer from an exponential increase of the leakage current due to the required enhanced capacitive coupling of the gate electrode to the channel region that is accomplished by decreasing the thickness of the silicon dioxide layer. For example, a channel length of approximately 0.08 µm may require a gate dielectric made of silicon dioxide as thin as approximately 1.2 nm. Although, generally, usage of high speed transistor elements having an extremely short channel may be restricted to high speed signal paths, whereas transistor elements with a longer channel may be used for less critical signal paths, the relatively high leakage current caused by direct tunneling of charge carriers through an ultra-thin silicon dioxide gate insulation layer may reach values for an oxide thickness in the range or 1-2 nm that may no longer be compatible with requirements for many types of integrated circuits.

Therefore, replacing silicon dioxide, or at least a part thereof, as the material for gate insulation layers has been considered. Possible alternative dielectrics include materials that exhibit a significantly higher permittivity so that a physically greater thickness of a correspondingly formed gate insulation layer nevertheless provides a capacitive coupling that would be obtained by an extremely thin silicon dioxide layer. It has thus been suggested to replace silicon dioxide with high permittivity materials such as tantalum oxide ($Ta_2O_5$), with a k of approximately 25, strontium titanium oxide ($SrTiO_3$), having a k of approximately 150, hafnium oxide ($HfO_2$), HfSiO, zirconium oxide ($ZrO_2$) and the like.

When advancing to sophisticated gate architectures based on high-k dielectrics, additionally, transistor performance may also be increased by providing an appropriate conductive material for the gate electrode to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance even at a less critical thickness compared to a silicon dioxide layer, while additionally maintaining leakage currents at an acceptable level. On the other hand, metal-containing non-polysilicon materials, such as titanium nitride and the like, may be formed so as to directly connect to the high-k dielectric material, thereby substantially avoiding the presence of a depletion zone. Therefore, the threshold voltage of the transistors is significantly affected by the work function of the gate material that is in contact with the gate dielectric material, and an appropriate adjustment of the effective work function with respect to the conductivity type of the transistor under consideration has to be guaranteed.

For example, appropriate metal-containing gate electrode materials, such as titanium nitride and the like, may frequently be used in combination with appropriate metal species, such as lanthanum, aluminum and the like, to adjust the work function to be appropriate for each type of transistor, i.e., N-channel transistors and P-channel transistors, which may require an additional band gap offset for the P-channel transistor. For this reason, it has also been proposed to appropriately adjust the threshold voltage of transistor devices by providing a specifically designed semiconductor material at the interface between the high-k dielectric material and the channel region of the transistor device in order to appropriately "adapt" the band gap of the specifically designed semiconductor material to the work function of the metal-containing gate electrode material, thereby obtaining the desired low threshold voltage of the transistor under consideration. Typically, a corresponding specifically designed semi-conductor material, such as silicon/germanium and the like, may be provided by an epitaxial growth technique at an early manufacturing stage, which may also present an additional complex process step, which, however, may avoid complex processes in an advanced stage for adjusting the work function and thus the threshold voltages in a very advanced process stage.

It turns out, however, that the manufacturing sequence of forming the threshold adjusting semiconductor alloy may have a significant influence on threshold variability and other transistor characteristics, as will be described in more detail with reference to FIGS. 1a-1e.

FIG. 1a schematically illustrates a cross-sectional view of a semiconductor device 100 comprising a substrate 101 above which is formed a silicon-based semiconductor material 102 having an appropriate thickness for forming therein and thereabove transistor elements. Moreover, an isolation structure 102C is formed in the semiconductor layer 102, thereby laterally delineating and thus forming active regions 102A, 102B. In this context, an active region is to be understood as a semiconductor material in which an appropriate dopant profile is to be created in order to form PN junctions for one or more transistor elements. In the example shown, the active region 102A corresponds to a P-channel transistor while the active region 102B represents an N-channel transistor. That is, the active regions 102A, 102B may comprise, in the manufacturing stage shown, an appropriate basic dopant concentration in order to determine the conductivity of a P-channel transistor and an N-channel transistor, respectively. Additionally, a mask layer 103 is formed in the active regions 102A, 102B in the form of a silicon dioxide material, which may be grown on the active regions 102A, 102B. Furthermore, an etch mask 104 is provided such that the active region 102B is covered, while the active region 102A, i.e., the mask layer 103 formed thereon, is exposed to an etch ambient 105.

The semiconductor device 100 as illustrated in FIG. 1a may be formed on the basis of the following conventional process strategies. First, the isolation structure 102C is formed on the basis of well-established lithography, etch, deposition, planarization and anneal techniques in which, for instance, a trench is formed in the semiconductor layer 102 on the basis of a lithography process, which is to be subsequently filled with an appropriate insulating material, such as silicon dioxide, silicon nitride and the like. After removing any excess material and planarizing the surface topography, the further processing is typically continued by performing a plurality of implantation sequences using an appropriate masking regime in order to introduce the required dopant species for generating the basic doping concentration in the active regions 102A, 102B corresponding to the type of transistors to be formed therein and thereabove. After activating the dopant species and re-crystallizing implantation-induced damage, the further processing is continued by forming the mask layer 103 on the basis of an oxidation process, followed by the deposition of a mask material such as a resist material that is subsequently patterned into the mask 104 by well-established lithography techniques. Next, the etch process 105 is performed, for instance using a wet chemical etch recipe based on, for instance, hydrofluoric acid (HF), which may remove silicon dioxide material selectively with respect to silicon material. During the etch process 105, therefore, material loss in the isolation structures 102C may also occur to a more or less pronounced degree, depending on the process parameters of the etch process 105.

FIG. 1b schematically illustrates the semiconductor device 100 after the above-described process sequence and after removal of the etch mask 104 (FIG. 1a). As described before, an increased surface topography may be created during the preceding etch process since typically a portion of the sidewalls 102S of the active region 102A may be exposed, depending on the required over etch time for reliably removing the mask layer 103 (FIG. 1a) from the active region 102A.

FIG. 1c schematically illustrates the semiconductor device when exposed to a further process ambient 106, which may typically be established in a deposition reactor for performing a selective epitaxial growth process. For example, elevated temperatures may be applied and appropriate reactive gas components may be used in order to remove any contaminants and oxide residues from the exposed surface areas of the active region 102A, for instance in the form of a native oxide and the like. Thus, during the process 106, additional material of the isolation structures 102C, as indicated by 102R, may be removed and the thickness of the mask layer 103 still covering the active region 102B may also be reduced. Consequently, the process 106 may further contribute to an increased exposure of the sidewall surface 102S.

FIG. 1d schematically illustrates the semiconductor device 100 during a selective epitaxial growth process 108, in which process parameters are selected in accordance with well-established recipes such that a significant material deposition is restricted to the exposed active region 102A, while a material deposition on dielectric surface areas, such as the isolation structure 102C and the mask layer 103 is strongly suppressed. During the selective epitaxial growth process 108, a silicon/germanium alloy 109 may, therefore, be selectively formed on the active region 102A, wherein, due to the exposed sidewall surface areas 102S, a pronounced material deposition may also occur above the isolation structure 102C. Generally, the material composition of the alloy 109 as well as a thickness thereof have a strong influence on the finally obtained threshold voltage of the P-channel transistor to be formed in and above the active region 102A. For example, in sophisticated applications, a target thickness of the silicon/germanium alloy 109 may be in the range of approximately 10-50 nm, wherein a thickness variation of several percent may result in a significant variability of the finally achieved transistor characteristics. Thus, due to the exposed sidewall surface areas 102S, a different deposition behavior may occur during the process 108 at the periphery of the active region 102A compared to a central region, which may contribute to a significant thickness non-uniformity.

FIG. 1e schematically illustrates the semiconductor device 100 when exposed to an etch ambient 110 in which the mask 103 (FIG. 1d) is removed selectively with respect to the active regions 102A, 102B. For this purpose, hydrofluoric acid may be used or any other appropriate selective etch chemistry so as to not unduly remove material of the active regions 102A, 102B. On the other hand, during the etch process 110, the resulting surface topography may further be increased by additionally removing material of the isolation structures 102C, thereby contributing to further irregularities at a peripheral area 102P around the active region 102A. Additionally, upon removing the mask layer 103, the final difference in the height level between the active region 102A, which comprises the silicon/germanium alloy 109, and the active region 102B may further be increased, which may also result in an increased degree of complexity during the further processing. That is, after the etch process 110, appropriate gate dielectric materials, which typically comprise a high-k dielectric material, are formed on the basis of oxidation in combination with deposition techniques, followed by the deposition of a complex gate electrode stack, which may typically comprise a metal-containing cap layer for the high-k dielectric material and one or more additional materials. Hence, the different height levels may also result in a certain degree of non-uniformity of the resulting gate stack. Consequently, during the complex patterning sequence for forming gate electrode structures in accordance with a desired critical gate length dimension, the difference in the height levels between the active regions 102A and 102B may result in a different gate length. Furthermore, the previously deposited silicon/germanium alloy 109 may have an intrinsic thickness variability due to the material growth at the exposed sidewall surface areas 102S, which may result in a corresponding variation along the transistor width direction, i.e., the direction perpendicular to the drawing plane of FIG. 1e. Due to the strong dependence of the resulting threshold voltage on the material characteristics of the silicon/germanium alloy 109, a pronounced variability of the threshold along the transistor width direction may also be observed, thereby resulting in a high degree of transistor variability and thus in a less reliable and less predictable transistor operation.

As a consequence, although the threshold voltage of P-channel transistors including sophisticated high-k metal gate stacks may be efficiently adjusted by providing the silicon/germanium alloy 109, nevertheless, a significant variability of the threshold voltages across a single transistor and also across a plurality of closely spaced transistors may be observed. Consequently, for sophisticated applications requiring highly scaled transistor elements having a gate length of 50 nm and less, the conventional strategy for adjusting the threshold voltage of P-channel transistors comprising a sophisticated high-k metal gate electrode structure may result in a pronounced yield loss due to threshold variabilities and non-uniformity of critical dimensions, such as the gate length of P-channel transistors and N-channel transistors.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally the present disclosure provides techniques and semiconductor devices in which a threshold adjusting semiconductor material, such as a silicon/germanium alloy, may be formed with enhanced uniformity by forming the epitaxial growth process prior to forming the isolation structures, thereby avoiding the presence of exposed sidewall areas of the active regions, which may thus result in a significantly enhanced uniformity in view of thickness and material composition of the semiconductor alloy. In some aspects disclosed herein, the threshold adjusting semiconductor alloy may be deposited on the basis of a non-masked semiconductor material which may further contribute to a superior deposition uniformity, wherein, after or prior to the formation of the isolation trenches, the semiconductor alloy may be selectively removed from active regions of transistor elements in which a threshold adjustment by the semiconductor alloy, such as N-channel transistors, may not be required. Consequently, on the basis of the semiconductor alloy having the enhanced uniformity, sophisticated gate electrode structures may be formed based on an appropriate work function metal that, in combination with the threshold adjusting semiconductor alloy, may provide a desired threshold voltage with enhanced uniformity. In other illustrative aspects disclosed herein, a difference in height levels of gate electrode structures formed above active regions having the semiconductor alloy and active regions without the semiconductor alloy may be reduced by forming a recess selectively in one of the active regions and subsequently forming the threshold adjusting semiconductor alloy in the recess. Consequently, the gate patterning process and in particular sophisticated lithography processes for providing corresponding gate masks may be performed on the basis of a superior topography, thereby reducing the variability of critical transistor dimensions, such as the gate length of the different types of transistors. In some illustrative embodiments disclosed herein, a mask for forming the recess may also be used as a growth mask so as to form the threshold adjusting semiconductor material selectively in the recess prior to forming the isolation structures. As a consequence, superior overall process uniformity may be accomplished, which may also provide enhanced flexibility in scheduling the material flow in complex semiconductor facilities since, for instance, any process deviations or queue time violations during the manufacturing sequence for forming the threshold adjusting semiconductor material may, at least to a certain degree, be compensated for by reworking corresponding substrates since the principles disclosed herein may provide various mechanisms for re-adjusting specific characteristics, such as thickness of the threshold adjusting semiconductor material and the like.

One illustrative method disclosed herein comprises forming a layer of a threshold adjusting semiconductor alloy on a semiconductor layer of a semiconductor device. The method further comprises forming an isolation structure in the threshold adjusting semiconductor alloy and the semiconductor layer, wherein the isolation structure laterally separates a first active region from a second active region. The method additionally comprises removing the layer of a threshold adjusting semiconductor alloy selectively from the second active region. Moreover, the method comprises forming a first gate electrode structure of a first transistor on the layer of a semiconductor alloy of the first active region and forming a second gate electrode structure of a second transistor on the second active region, wherein the first and second gate electrode structures comprise a high-k dielectric gate insulation layer and a metal-containing gate electrode material.

A further illustrative method disclosed herein comprises forming a recess in a first area of a semiconductor layer of a semiconductor device, while a second area of the semiconductor layer is masked. The method further comprises forming a threshold adjusting semiconductor material at least in the recess and forming an isolation structure after forming the threshold adjusting semiconductor material, wherein the isolation structure laterally delineates a first active region in the first area and a second active region in the second area. Additionally, the method comprises forming a first gate electrode structure of a first transistor on the threshold adjusting semiconductor material in the first active region and forming a second gate electrode structure of a second transistor on the second active region.

One illustrative semiconductor device disclosed herein comprises a first active region formed in a semiconductor layer and comprising a threshold adjusting semiconductor alloy that is formed on the semiconductor layer, wherein the first active region extends to a first height level. The semiconductor device further comprises a second active region formed in the semiconductor layer and extending to a second height level, wherein a difference between the first and second height levels is less than a thickness value of the threshold adjusting semiconductor alloy. The semiconductor device further comprises a first gate electrode structure formed on the threshold adjusting semiconductor alloy and comprises a high-k dielectric material and a first metal-containing electrode material that is formed above the high-k dielectric material. The semiconductor device further comprises a second gate electrode structure formed on the semiconductor layer of the second active region and comprising the high-k dielectric material and a second metal-containing electrode material that is formed above the high-k dielectric material.

BRIEF DESCRIPTION OF THE DRAWINGS

The disclosure may be understood by reference to the following description taken in conjunction with the accompanying drawings, in which like reference numerals identify like elements, and in which.

Figure 1A:
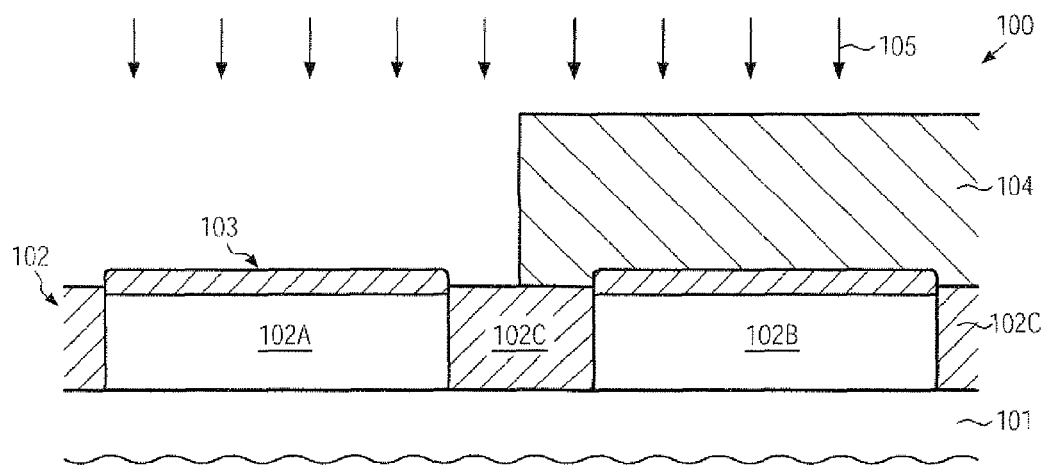
FIGS. 1a-1e schematically illustrate cross-sectional views of a sophisticated semi-conductor device during various manufacturing stages in forming a threshold adjusting silicon/germanium alloy selectively in the active region of a P-channel transistor in accordance with conventional strategies, thereby obtaining a significant variability due to a pronounced surface topography.
Figure 1B:
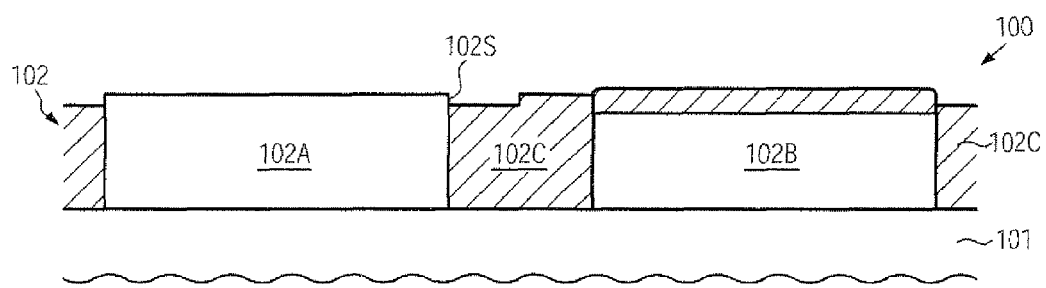
Figure 1C:
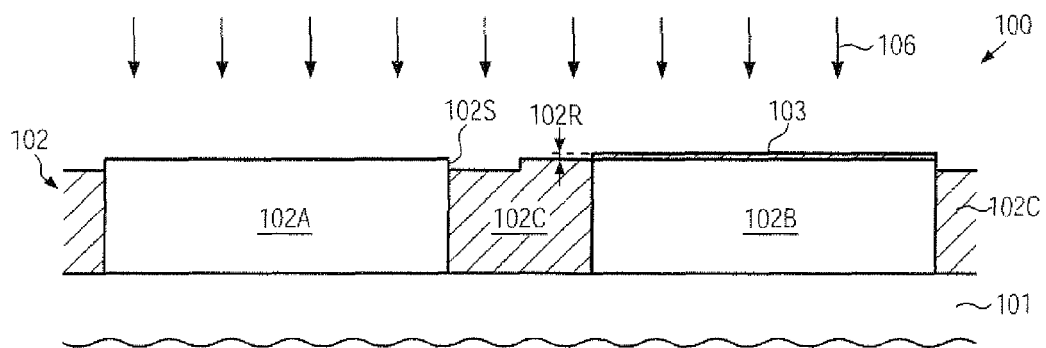
Figure 1D:
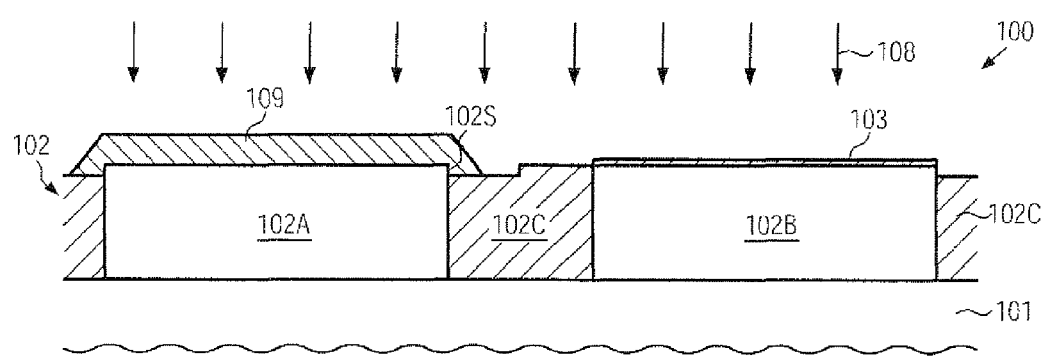
Figure 1E:
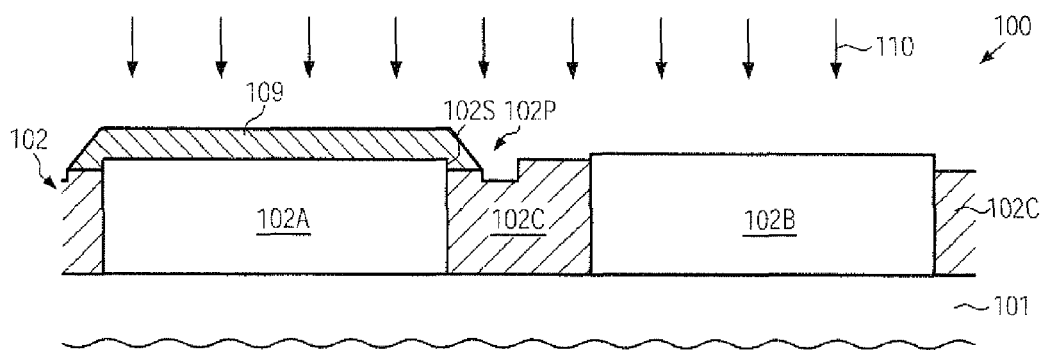

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure contemplates manufacturing techniques and semiconductor devices in which the threshold adjusting semiconductor material may be provided with enhanced process uniformity by generally forming the semiconductor material prior to forming corresponding isolation structures. For this purpose, in some illustrative embodiments, the semiconductor alloy may be deposited on the basis of a non-masked selective epitaxial growth process, thereby providing superior process uniformity, for instance, with respect to layer thickness, material composition and the like. Thereafter, the isolation structures may be formed so as to define the corresponding active regions, wherein the semiconductor alloy may be removed selectively from one of the active regions on the basis of well-controllable etch techniques while still maintaining the superior uniformity of the threshold adjusting semiconductor alloy in the other type of active regions. In this manner, deposition-related irregularities, as for instance discussed above with respect to the semiconductor device 100, may be avoided or at least significantly reduced, which may therefore result in superior transistor characteristics.

Moreover, in other illustrative embodiments, in addition to enhanced uniformity in providing the threshold adjusting semiconductor alloy, a difference in height level of the active regions may also be reduced by providing a recess in the active region that may receive the threshold adjusting semiconductor alloy. To this end, in some illustrative embodiments, the recess may be formed on the basis of an appropriate etch mask, which may be removed to subsequently deposit the threshold adjusting semiconductor alloy in a non-masked growth process. Prior to or after forming the isolation structure, the semiconductor alloy may then be selectively removed from one of the active regions by highly selective etch recipes and the further processing may be continued on the basis of regions having a similar height level due to the previously provided recess. In still other illustrative embodiments, the recess may be formed on the basis of a mask, which may additionally be used as a growth mask during the subsequent selective epitaxial growth process. Hence, a superior fill behavior may also be obtained since any isolation structures having a pronounced surface topography may not be present during the selective epitaxial growth process. Thereafter, the mask may be removed and the further processing may be continued by forming the isolation structure, wherein a height level between the different active regions may be very similar due to the previously formed recess.

Hence, the further processing, i.e., the patterning of a sophisticated gate stack, may be accomplished on the basis of a reduced difference in height level, which may also reduce any differences in critical dimensions, such as gate length, due to a superior performance of the critical lithography process.

Figure 2A:
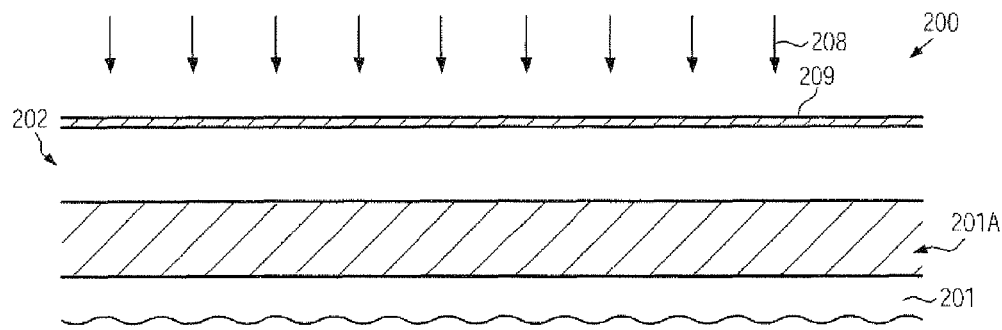
FIGS. 2a-2h schematically illustrate cross-sectional views of a semiconductor device during a manufacturing sequence for forming a threshold adjusting semiconductor alloy prior to forming isolation structures and selectively removing the semiconductor alloy in a later manufacturing stage, according to illustrative embodiments.
Figure 2B:
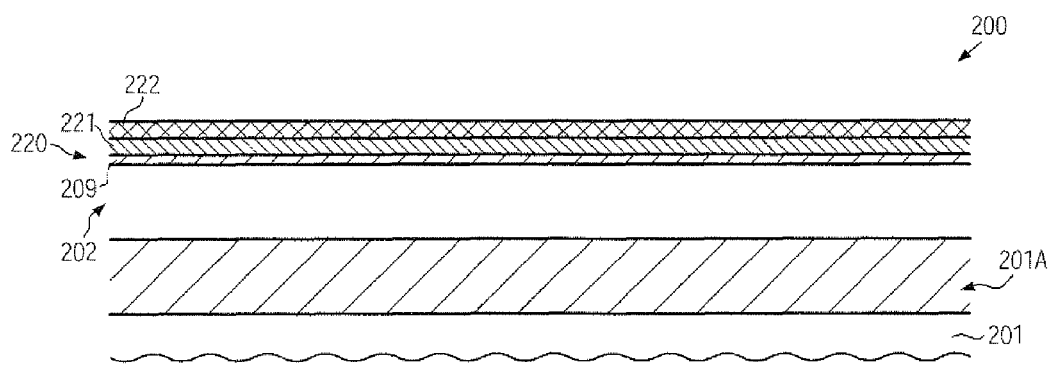
Figure 2C:
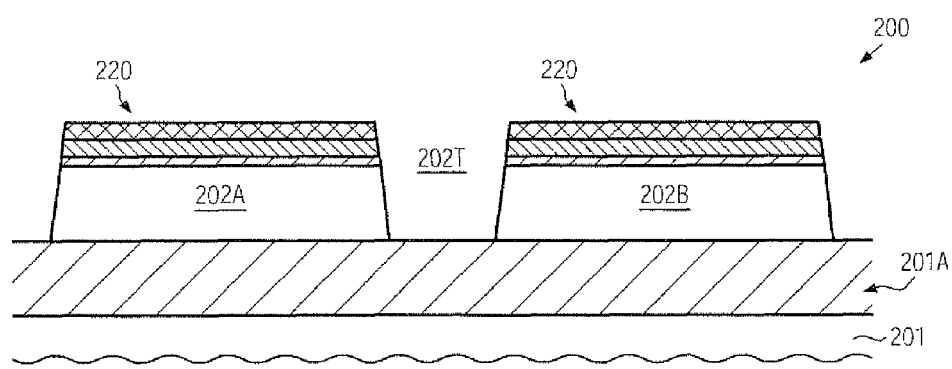
Figure 2D:
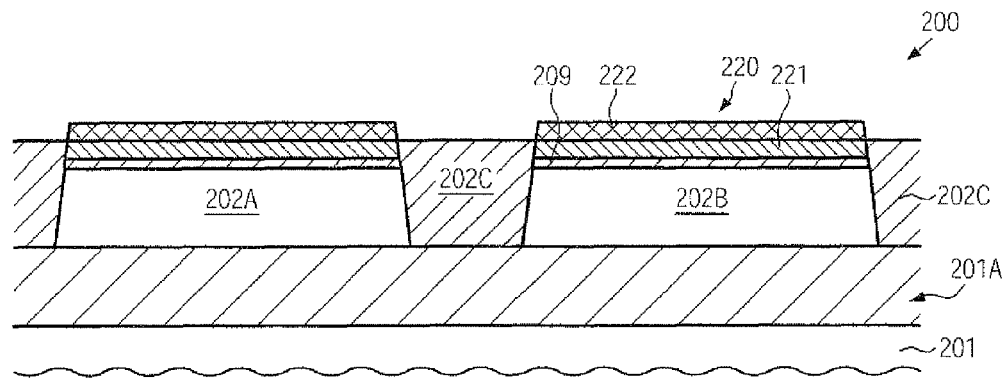
Figure 2E:
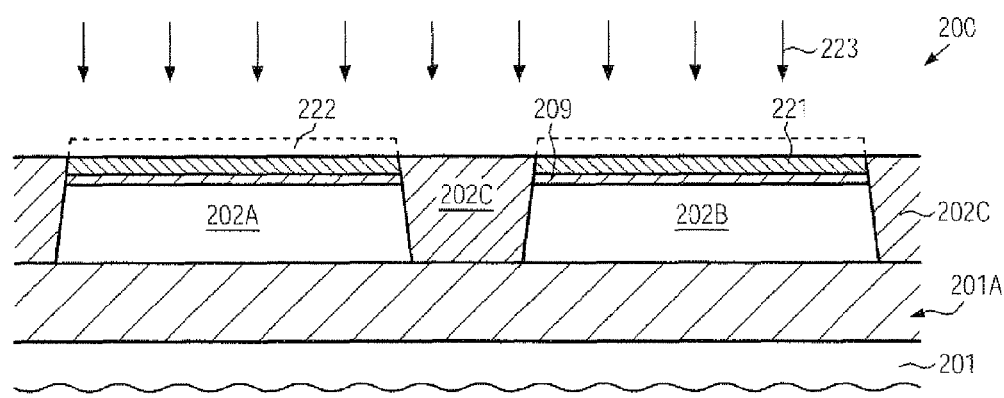
Figure 2F:
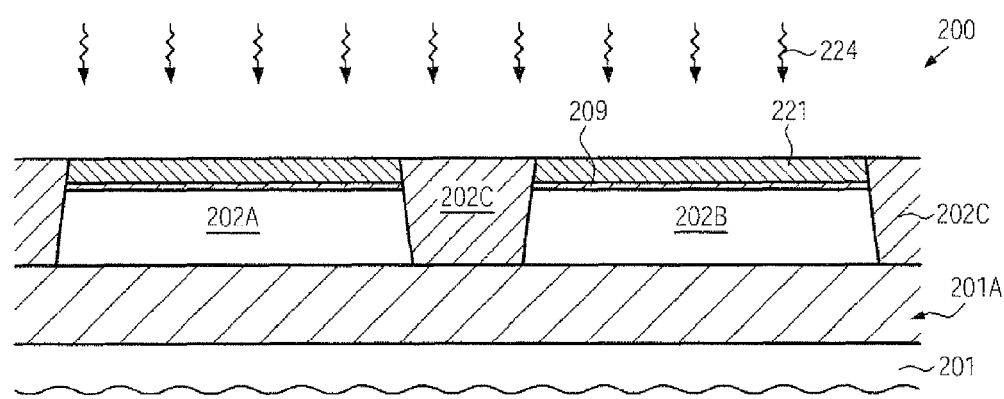
Figure 2G:
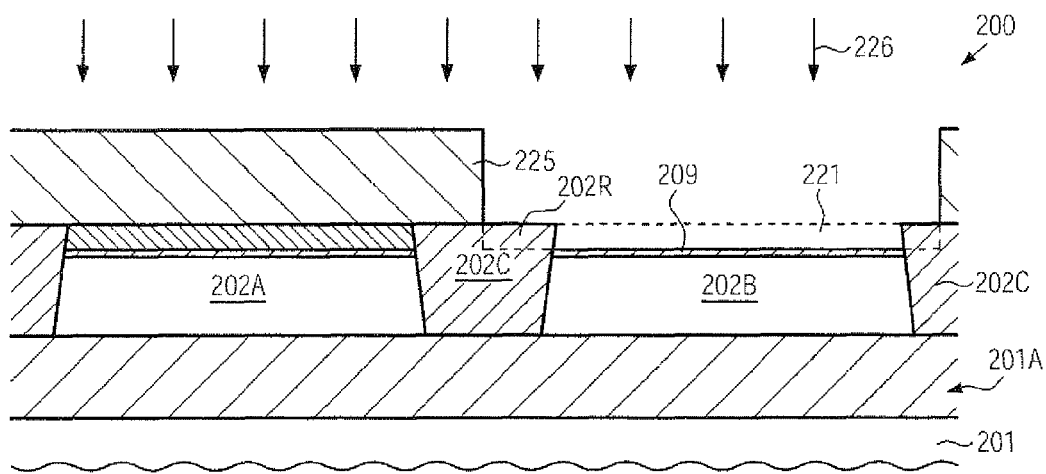
Figure 2H:
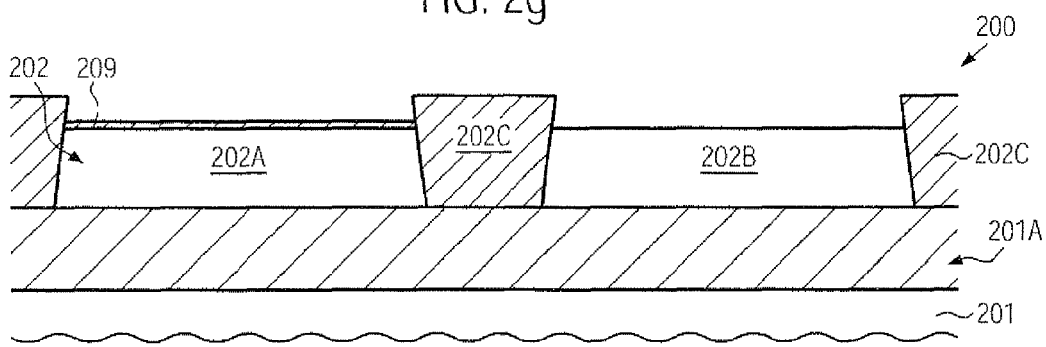
Figure 2I:
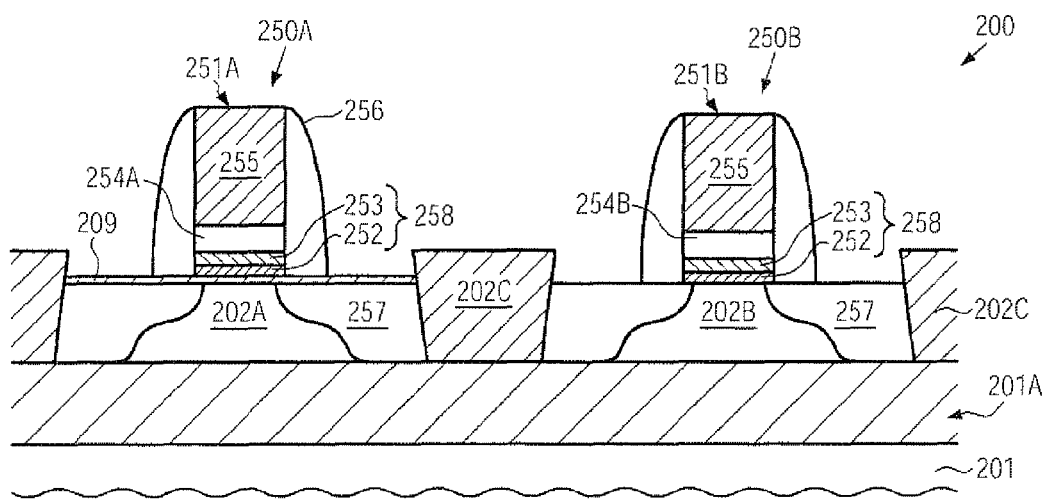
FIG. 2i schematically illustrates a cross-sectional view of the semiconductor device in a further advanced manufacturing stage wherein gate electrode structures of different transistor types may be provided, wherein the threshold voltage of one transistor may be adjusted on the basis of the semiconductor alloy provided with enhanced uniformity, according to illustrative embodiments.
Figure 2J:
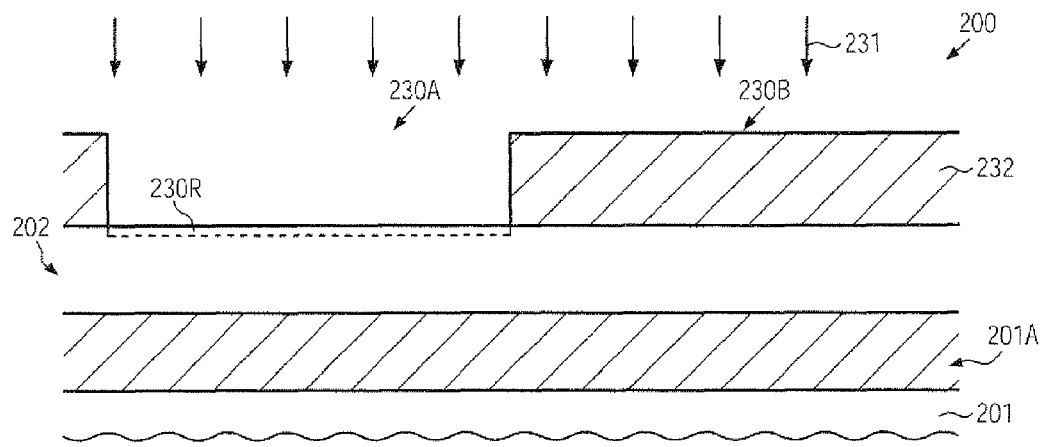
FIGS. 2j-2m schematically illustrate cross-sectional views of the semiconductor device according to further illustrative embodiments in which a recess may be selectively formed in an area corresponding to an active region receiving a threshold adjusting semiconductor alloy.
Figure 2K:
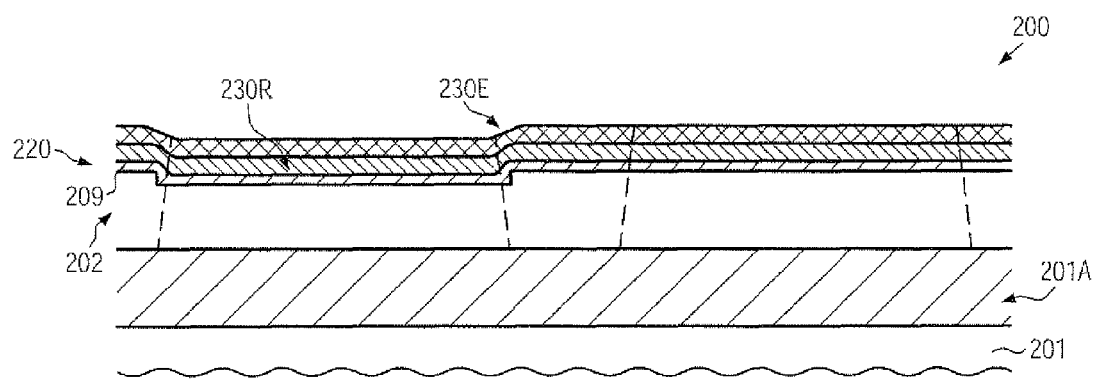
Figure 2L:
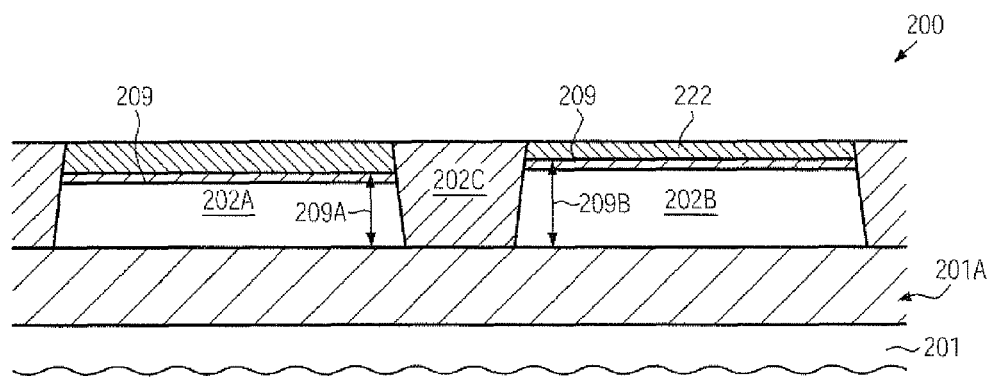
Figure 2M:
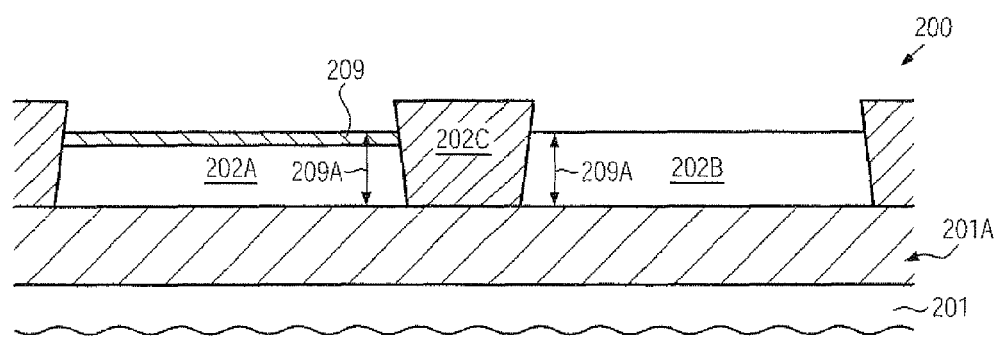
Figure 2N:
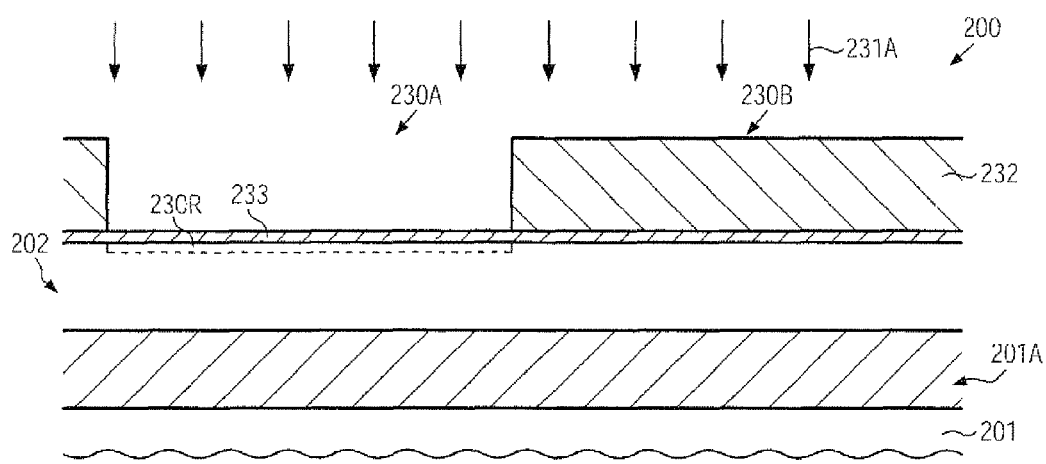
FIGS. 2n-2q schematically illustrate cross-sectional views of the semiconductor device according to still further illustrative embodiments in which a recess may be selectively formed on the basis of a mask, which may also be used for selectively depositing the threshold adjusting semiconductor alloy prior to forming isolation structures.
Figure 2O:
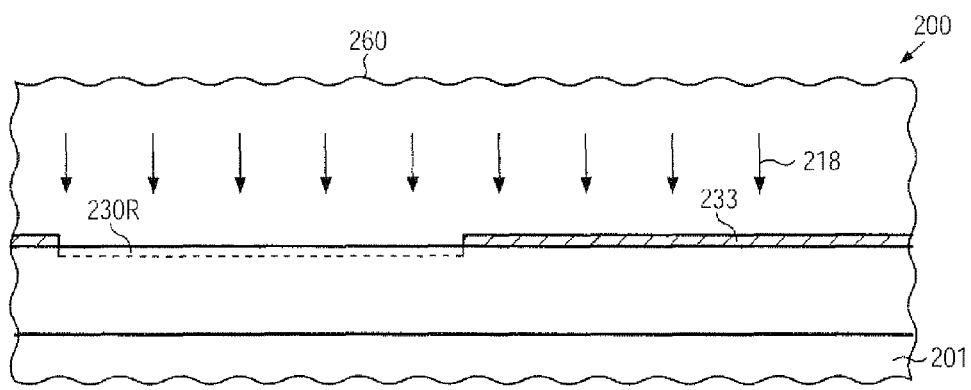
Figure 2P:
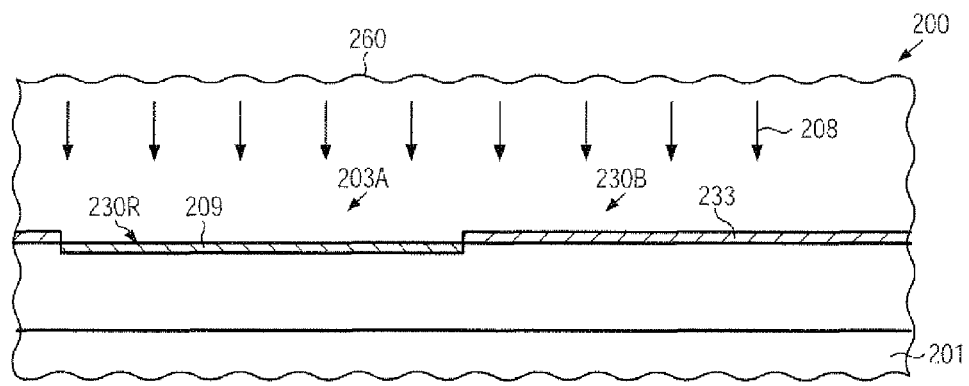
Figure 2Q:
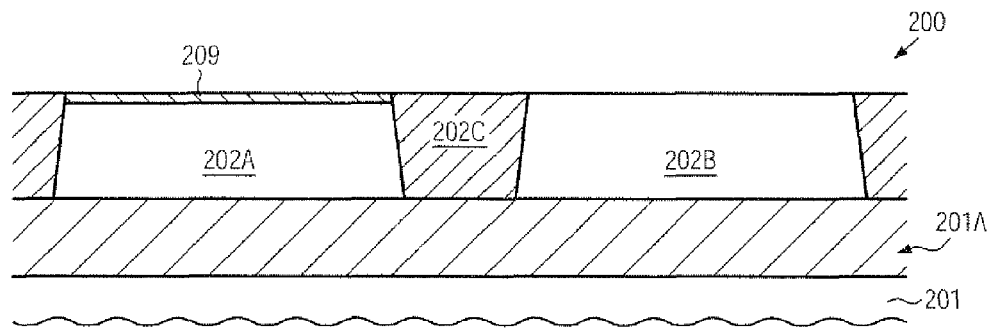

With reference to FIGS. 2a-2q, further illustrative embodiments will now be described in more detail, wherein reference may also be made to FIGS. 1a-1e, if required.

FIG. 2a schematically illustrates a cross-sectional view of a semiconductor device 200 which may comprise a substrate 201 above which is formed a semiconductor layer 202, such as a silicon-based layer, which may require a corresponding adaptation of band gap energy for one type of transistor, as explained above. Furthermore, in the embodiment shown, a buried insulating layer 201A may be located between the semiconductor layer 202 and the substrate 201, thereby providing a silicon-on-insulator (SOI) configuration. If some device areas required in the buried insulating layer 201A may be omitted, thereby providing a "bulk" configuration wherein the semiconductor layer 202 may represent an upper portion of a substantially crystalline material of the substrate 201. Moreover, in the manufacturing stage shown, the semiconductor device 200 may be exposed to a deposition ambient 208 so as to form a threshold adjusting semiconductor alloy 209 on the semiconductor layer 202. The semiconductor alloy 209 may be provided in the form of any appropriate material composition that provides a required band gap offset with respect to a high-k metal gate stack still to be formed such that the desired threshold voltage of a corresponding transistor may be obtained. For example, the semiconductor alloy 209 may be comprised of silicon/germanium with a specified germanium concentration, for instance, of approximately 25 atomic percent or less, depending on the device requirements. Furthermore, the layer 209 may have a specific thickness, since the material composition and the thickness may have a significant influence on the finally obtained threshold voltage, as explained above. For example, an average thickness of the layer 209 may be approximately 5-15 nm with a thickness variability of approximately less than 5 percent across the entire substrate 201 while in a local manner, i.e., in a local scale corresponding to an active region of the device 200 still to be formed in a later manufacturing stage, a thickness variability may be approximately 2 percent or even less.

The semiconductor device 200 as illustrated in FIG. 2a may be formed on the basis of well-established process techniques for providing the semiconductor layer 202 above the substrate 201. After any processes for enhancing the surface quality of the layer 202, for instance by performing cleaning processes to remove a native oxide, contaminants and the like, which may be established on the basis of well-established process techniques, the deposition ambient 208 may be established on the basis of appropriate parameters and precursor materials in which reducible gases containing the desired semiconductor species may be reacted with a reducing gas to initiate the deposition of the desired material composition. It should be appreciated that, in some illustrative embodiments, the epitaxial growth process 208 may be provided as a non-masked process in which the entire substrate 201 may receive the layer 209. In this case, process parameters may be selected such that a "non-selective" deposition behavior may be provided since any dielectric surface areas may not be present in this case. In other illustrative embodiments, the deposition process 208 may be performed on the basis of a "selective" deposition recipe, for instance, certain device areas may be masked in a global manner in order to avoid deposition of the material 209, if considered appropriate. In any case, uniformity of the material layer 209 with respect to material composition and layer thickness may be enhanced due to the avoidance of pattern loading effects and in particular avoiding a pronounced surface topography, as is described above with reference to the semiconductor device 100.

FIG. 2b schematically illustrates the semiconductor device 200 in a further advanced manufacturing stage in which a mask layer 220 may be formed on the semiconductor alloy 209, wherein the mask layer 220 may have any appropriate configuration that may be required for forming isolation structures in the semiconductor layer 202 and the semiconductor alloy 209 in a subsequent manufacturing stage. For example, the mask layer 220 may comprise a first sub-layer 221, for instance comprised of silicon dioxide, followed by a second sub-layer 222, such as a silicon nitride layer. The mask layer 220 may be formed on the basis of any appropriate manufacturing technique, such as oxidation and/or deposition for the layer 221 and appropriate deposition techniques such as chemical vapor deposition (CVD) and the like for the layer 222. Thereafter, a lithography process may be performed in order to provide a resist mask that may define the lateral position and size of isolation trenches to be formed in the mask layer 220 and also in the layers 209 and 202. A corresponding lithography process may be performed on the basis of well-established recipes including sophisticated lithography techniques and anisotropic etch processes. For example, the mask layer 220 may be patterned first and may be used as a hard mask material for etching into the semiconductor materials 209 and 202. It should be appreciated, however, that any other appropriate patterning regime may be used for forming corresponding isolation trenches.

FIG. 2c schematically illustrates the semiconductor device 200 after the above-described process sequence. That is, an isolation trench 202T may extend through the mask layer 220 and through the semiconductor materials 209 and 202 and may thus define the lateral position and size of a first active region 202A and a second active region 202B. In the embodiment shown, the first active region 202A is to receive a gate electrode structure that has to be adapted with respect to threshold voltage on the basis of the semiconductor alloy 209, while the active region 202B may represent an area for one or more transistor elements that may not require the threshold adjusting semiconductor alloy 209. As illustrated, the isolation trench 202t may extend to a specified depth within the semiconductor layer 202, when a bulk configuration is considered and may extend to the buried insulating layer 201A in the case of an SOI architecture.

FIG. 2d schematically illustrates the semiconductor device 200 in a manufacturing stage in which an isolation structure 202C may be provided on the basis of the isolation trenches 202T (FIG. 2c), which may be accomplished by forming any appropriate dielectric fill material, for instance by oxidation and deposition, and subsequently removing any excess material by any appropriate planarization technique, such as chemical mechanical polishing (CMP) and the like. During the removal process, the mask layer 220, such as the second sub-layer 221, may be used as a stop material in order to reliably control the removal process. For example, the isolation structures 202C may be substantially comprised of silicon dioxide which may be efficiently removed selectively to silicon nitride material on the basis of well-established selective CMP techniques.

FIG. 2e schematically illustrates the semiconductor device 200 in a further advanced manufacturing stage in which the second sub layer 222 may be selectively removed with respect to the layer 221 on the basis of any appropriate etch process 223. For example, the etch process 223 may be performed on the basis of a selective wet chemical etch recipe for removing silicon nitride material selectively with respect to silicon dioxide. For this purpose, a plurality of etch chemistries are available. Thereafter, in some illustrative embodiments, the further processing may be continued by selectively removing the layer 221 from above the active region 202B, as will be described later on in more detail. In other illustrative embodiments, a further modification of the layer 221 may be applied so as to provide a superior process margin for the further processing of the semiconductor device 200.

FIG. 2f schematically illustrates the semiconductor device 200 during a surface modification process 224, in which one or more characteristics of the layer 221 may be modified in order to provide superior "insensitivity" with respect to variabilities in the overall process sequence. For example, in complex semiconductor facilities, a large number of products, even of very different types, may have to be processed in accordance with a specified schedule in which appropriate process recipes may have to be applied in the various process tools. An efficient scheduling may thus provide a high tool utilization which may translate into a reduced cycle time and increased output, while, however, certain constraints may have to be respected. For example, certain subsequent processes may not be very tolerable with respect to a variation in queue time or waiting time, since a corresponding modification of materials may occur which may then result in a different process output. For example, native oxides may be formed, contaminations may be created due to exposure to the clean room ambient and the like. Thus, the modification process 224 may provide a certain degree of rectification of irregularities in the scheduling of the overall process flow, for instance by re-oxidizing the layer 221, which may thus enable a re-adjustment of, for instance, the thickness of the semiconductor alloy 209 in a highly controllable manner. Furthermore, the process 224 may also provide additional process margins with respect to deviations that may be observed in many processes prior to and during the deposition of the material 209, for instance by appropriately adapting any thickness variations that may have resulted due to process variabilities in an earlier manufacturing stage. Similarly, process variations of subsequent manufacturing steps, which may be determined on the basis of substrates in an advanced manufacturing stage, may also be taken into consideration by appropriately adapting process parameters of the process 224.

FIG. 2g schematically illustrates the semiconductor device 200 in a further advanced manufacturing stage in which an etch mask 225 may be provided to cover the active region 202A while exposing the active region 202B to an etch ambient 226. During the etch process 226, the exposed portion of the mask layer 221 may be removed selectively to the material 209 and subsequently the mask 225 may be removed, if desired, and the material 209 may be removed selectively to the mask 221 formed above the active region 202A. In other cases, the process sequence 226 may be performed on the basis of the mask 225 so as to also remove material 209 on the basis of the mask 225. For the etch process 226, any appropriate plasma assisted or wet chemical etch recipes are available and may be applied. It should be appreciated that a certain degree of material loss may also occur in exposed portions of the isolation structure 202C, as indicated by 202R, which, however, may not significantly affect the further processing of the device 200.

FIG. 2h schematically illustrates the semiconductor device 200 in a further advanced manufacturing stage, i.e., after the removal of the mask 225 and the mask material 221 (see FIG. 2g) from above the first active region 202A. Consequently, the threshold adjusting semiconductor alloy 209 having the superior uniformity with respect to material composition and layer thickness may be formed selectively in the first active region 202A, while the active region 202B may be formed entirely from material of the semiconductor layer 202. Consequently, the further processing, i.e., the patterning of a sophisticated gate electrode structure above the active regions 202A, 202B may be continued on the basis of a uniform layer 209, while also the surface topography with respect to the isolation structures 202C may be enhanced compared to the prior art manufacturing strategy.

FIG. 2i schematically illustrates the semiconductor device 200 in a further advanced manufacturing stage. As illustrated, a first transistor 250A is formed in and above the active region 202A comprising, at least partially, the semiconductor alloy 209, while a second transistor 250B may be formed in and above the active region 202B. The transistors 250A, 250B may comprise gate electrode structures 251A, 251B, respectively, which may comprise sophisticated materials for enhancing overall performance of the transistors 250A, 250B. As illustrated, the gate electrode structures 251A, 251B may comprise a high-k gate insulation layer 258, which may comprise any appropriate high-k dielectric material, for instance in the form of materials as discussed above. In the embodiment shown, the high-k gate insulation layer 258 may comprise a first dielectric material 252, for instance provided in the form of a dielectric material having a reduced permittivity, followed by a high-k dielectric material 253 having a dielectric constant of 10.0 and higher. As illustrated, the gate insulation layer 258 of the transistor 250A may be formed on the threshold adjusting semiconductor alloy 209, which may have a superior uniformity, for instance with respect to thickness variation along a transistor width direction, i.e., a direction perpendicular to the drawing plane of FIG. 2i. On the other hand, the gate insulation layer 258 of the transistor 250B may be directly formed on the initial material of the active region 202B. Furthermore, the gate electrode structure 251A may comprise a metal-containing electrode material 254A, which may be appropriately selected so as to define a desired work function in combination with the alloy 209, thereby providing the desired threshold voltage of the transistor 250A. On the other hand, the gate electrode structure 251B may comprise a metal-containing electrode material 254B so as to obtain the desired work function and thus threshold voltage for the transistor 250B. It should be appreciated that, depending on device requirements and the manufacturing sequence, the materials 254A, 254B may have substantially the same material composition if appropriate work function adjusting species may be incorporated into the gate insulation layers 258 in the preceding manufacturing sequence. Furthermore, an additional electrode material or a placeholder material 255, depending on the further process strategy, for instance in the form of polysilicon and the like, may be formed on the electrode materials 254A, 254B, respectively. Additionally, a spacer structure 256 may be formed on sidewalls of the gate electrode structures 251A, 251B. Additionally, the transistors 250A, 250B may comprise drain and source regions 257 according to the overall transistor characteristics and conductivity type.

The semiconductor device 200 as illustrated in FIG. 2*i* may be formed on the basis of any appropriate manufacturing strategy in order to form the gate electrode structures 251A, 251B on the basis of a sophisticated material stack. As previously indicated, due to the superior uniformity of the layer 209 in a local and also in a global manner, the patterning sequence for forming the gate electrode structure 251A may by significantly enhanced, thereby also reducing threshold variability along the transistor width direction and also reducing threshold variability across different transistors having formed therein the threshold adjusting semiconductor material 209. After patterning the gate electrode structures 251A, 251B, any further performance enhancing mechanisms may be implemented, such as the incorporation of a strain-inducing semiconductor alloy in one or both of the active regions 202A, 202B (not shown), followed by the formation of the drain and source regions 257 in combination with the spacer structure 256, wherein well-established process techniques may be applied.

With reference to FIGS. 2*j*-2*q*, further illustrative embodiments will now be described in which, in addition to superior uniformity of the threshold adjusting semiconductor alloy, a reduced difference in height levels between various active regions may also be accomplished by selectively forming a recess in the active region that may receive the threshold adjusting semiconductor alloy.

FIG. 2*j* schematically illustrates the semiconductor device 200 in a manufacturing stage prior to forming isolation structures and prior to depositing the threshold adjusting semiconductor alloy. As illustrated, a mask 232 may be formed above the semiconductor layer 202 so as to expose a first area 230A and to cover a second area 230B. That is, the areas 230A, 230B represent device regions in which a first active region and a second active region are to be formed in a later manufacturing stage, which are laterally separated by an isolation structure, as described above. The mask 232 may be comprised of any appropriate material, such as resist material, a hard mask material and the like. Furthermore, the semiconductor device 200 may be exposed to an etch ambient 231, which may be established on the basis of a plasma assisted etch recipe in order to remove material of the semiconductor layer 202 to form a recess 230R in the first area 230A. For example, a plurality of plasma assisted etch recipes are available for removing silicon material selectively to a plurality of other materials, such as photoresist, silicon dioxide, silicon nitride and the like. In still other illustrative embodiments, the etch process 231 may be performed on the basis of a wet chemical etch recipe, such as crystallographically anisotropic etch recipes, isotropic etch recipes and the like, since edge effects at the periphery of the area 230A may be negligible when, for instance, an isolation structure is to be formed in this part of the area 230A. In still other illustrative embodiments, a selective oxidation in the area 230A may be performed, for instance, on the basis of a chemical oxidation and the like, wherein the oxide may be efficiently removed on the basis of any appropriate etch recipe during the process 231. Hence, the recess 230R may be formed in a well-controllable manner.

FIG. 2*k* schematically illustrates the semiconductor device 200 in a further advanced manufacturing stage in which the semiconductor alloy 209 may be formed on the semiconductor layer 202 and within the recess 230R, followed by the mask layer 220. With respect to any deposition techniques and material characteristics related to the layers 209 and 220, the same criteria may apply as previously explained. It should be appreciated that, in some illustrative embodiments, the thickness of the layer 209 and a depth of the recess 230R may be appropriately selected so as to obtain a desired planar surface topography in a later manufacturing stage. Next, the further processing may be continued by forming the isolation structures 202C (see FIG. 2*l*), the size and position of which is indicated by the dashed lines in FIG. 2*k*, wherein, in some illustrative embodiments, the isolation structure 202C may be positioned such that an edge 230E of the area 230R may be removed during the further processing, thereby removing any possible minor irregularities in this region.

FIG. 2*l* schematically illustrates the semiconductor device 200 in a further advanced manufacturing stage. As illustrated, the isolation structure 202C may be formed so as to laterally separate the active region 202A from the active region 202B, which may both comprise the semiconductor alloy 209 followed by the mask material 222. It should be appreciated that the material 209 in the active region 202B may be provided so as to exhibit a height level 209B that is higher than a height level 209A of the material 209 in order to provide a superior surface topography after the removal of the material 209 from above the active region 202B. With respect to any manufacturing techniques for forming the isolation structure 202C, it may be referred to the embodiments described above.

FIG. 2*m* schematically illustrates the semiconductor device 200 in a further advanced manufacturing stage. As illustrated, the active region 202A comprises the material 209, while the material 209 may be removed from the active region 202B. Furthermore, a height level of the active region 202B may be very similar to the height level of the active region 202A including the material 209, due to the previously formed recess. In this respect, a height level is to be understood as the average thickness of the active regions 202A, 202B, wherein, in the case of a bulk configuration, the thickness of an active region is to be understood as a distance from the bottom of a neighboring isolation structure to the top surface of the active region.

On the basis of the device configuration as shown in FIG. 2*m*, the further processing may be continued by patterning gate electrode structures, as previously described, wherein the height levels of the active regions 202A, 202B may be very similar, for instance substantially corresponding to the height level 209A, thereby providing superior conditions for adjusting a critical dimension, such as the gate length, which may be approximately 50 nm and significantly less in sophisticated applications.

FIG. 2*n* schematically illustrates the semiconductor device 200 according to further illustrative embodiments. As illustrated, in this case, a mask 232 exposing the area 230A and covering the area 230B may be formed above a mask layer 233, which may be comprised of any appropriate material, such as silicon dioxide, silicon nitride and the like. The mask layer 233 may be formed on the basis of any appropriate technique, such as oxidation, deposition and the like. Moreover, during an etch process 231A, the mask layer 233 may be patterned, which may be accomplished on the basis of any appropriate etch recipe. Furthermore, in some illustrative embodiments, the etch process 231A may further comprise an etch step for etching into the semiconductor layer 202 so as to form the recess 230R. For this purpose, any appropriate etch technique may be used, as described above. In other illustrative embodiments, after patterning the mask layer 233, the mask 232 may be removed and the further processing may be performed on the basis of the patterned mask layer 233.

FIG. 2*o* schematically illustrates the semiconductor device 200 in a further advanced manufacturing stage wherein the patterned mask layer 233 may be used as an etch mask during an etch process 218 in order to form the recess 230R. In one illustrative embodiment, the etch ambient 218 may be established in a process environment, i.e., a process chamber 260, which may also be used for the selective deposition of the threshold adjusting semiconductor material in the recess 230R. For this purpose, appropriate process gases, as may also be used during the subsequent deposition process, may be applied in part during the process 218 in order to form the recess 230R with a high degree of controllability.

It should be appreciated that, in other illustrative embodiments, the etch step 218 may be omitted when the recess 230R has been formed on the basis of the mask 232, as described above with reference to FIG. 2*n*.

FIG. 2*p* schematically illustrates the semiconductor device 200 during the deposition process 208, which is appropriately designed as a selective epitaxial growth process, as is also previously described. For example, in the embodiment shown, the deposition ambient 208 may be established in the process environment 260, which, in some illustrative embodiments, may also be used for forming the recess 230R, as discussed above. Consequently, during the process 208, the threshold adjusting semiconductor alloy 209 may be selectively formed in the recess 230R, since a significant material deposition on the mask layer 233 may be suppressed. Thus, superior uniformity of the material composition and layer thickness of the material 209 may be obtained within the area 230A.

FIG. 2*q* schematically illustrates the semiconductor device 200 in a further advanced manufacturing stage. As illustrated, the mask layer 233 (FIG. 2*p*) has been removed, for instance, by using any appropriate selective etch recipe, such as hydrofluoric acid and the like when the material 233 is comprised of silicon dioxide material. However, any other wet chemical etch recipe may be applied, depending on the material characteristics of the mask layer 233. Thereafter, the further processing may be continued, as previously described above, in order to form the isolation structure 202C, thereby defining the active regions 202A, 202B. Thus, the active region 202A, which comprises the material 209, and the active region 202B may be provided with a superior surface topography since the height levels of these active regions may be selected to be very similar due to the selective recessing of the active region 202A.

As a result, the present disclosure provides semiconductor devices and manufacturing techniques in which a threshold adjusting semiconductor alloy, such as a silicon/germanium alloy, may be provided prior to forming isolation structures, thereby achieving superior uniformity of the semiconductor alloy. Consequently, sophisticated gate electrode structures on the basis of high-k materials and metal-containing electrode materials may be formed so as to exhibit a significantly reduced variability with respect to the threshold voltage due to the superior uniformity of the threshold adjusting semiconductor alloy.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
    forming a layer of a threshold adjusting semiconductor alloy on and in contact with a semiconductor layer of a semiconductor device;
    forming an isolation structure in said layer of said threshold adjusting semiconductor alloy and said semiconductor layer, said isolation structure laterally separating a first active region and a second active region;
    removing said layer of said threshold adjusting semiconductor alloy selectively from said semiconductor layer in said second active region while leaving said layer of said threshold adjusting semiconductor alloy on said first active region; and
    forming a first gate electrode structure of a first transistor on said layer of a semiconductor alloy of said first active region and forming a second gate electrode structure of a second transistor on said second active region, said first and second gate electrode structures comprising a high-k dielectric gate insulation layer and a metal-containing gate electrode material.

2. The method of claim 1, wherein forming said isolation structure comprises forming a mask layer on said layer of said threshold adjusting semiconductor alloy, forming a trench in said mask layer, said layer of said threshold adjusting semiconductor alloy and said semiconductor layer and filling said trench with an insulating material.

3. The method of claim 2, wherein forming said mask layer comprises forming a first mask material on said layer of said threshold adjusting semiconductor alloy and forming a second mask material on said first mask material.

4. The method of claim 3, wherein forming said first mask material comprises forming an oxide material and wherein said method further comprises re oxidizing said first mask material after forming said isolation structure.

5. The method of claim 1, further comprising forming a recess in said semiconductor layer at an area that at least corresponds to said first active region prior to forming said layer of said threshold adjusting semiconductor alloy.

6. The method of claim 5, wherein forming said recess comprises forming an etch mask so as to expose said area and performing an etch process and wherein said method further comprises removing said etch mask prior to forming said layer of said threshold adjusting semiconductor alloy.

7. The method of claim 6, wherein forming said recess further comprises performing a plasma assisted etch process.

8. The method of claim 6, wherein forming said recess further comprises performing a wet chemical etch process.

9. The method of claim 1, wherein said layer of said threshold adjusting semiconductor alloy is formed as a silicon/germanium alloy.

10. The method of claim 9, further comprising forming drain and source regions of a P-channel transistor in said first active region.

11. A method, comprising:
forming a recess in a first area of a semiconductor layer of a semiconductor device while masking a second area of said semiconductor layer;
forming a threshold adjusting semiconductor material above said semiconductor device, said threshold adjusting semiconductor material being formed on and contact with said semiconductor layer in said first and second areas including said recess formed in said first area;
forming an isolation structure after forming said threshold adjusting semiconductor material, said isolation structure laterally delineating a first active region in said first area and a second active region in said second area; and
forming a first gate electrode structure of a first transistor on said threshold adjusting semiconductor material in said first active region and forming a second gate electrode structure of a second transistor on said second active region.

12. The method of claim 11, wherein forming said first and second gate electrode structures comprises forming a high-k dielectric material above said first and second active regions and forming a metal-containing electrode material above said high-k dielectric material.

13. The method of claim 11, wherein forming said recess comprises forming an etch mask above said semiconductor layer so as to expose said first area and cover said second area, performing an etch process and removing said etch mask prior to forming said threshold adjusting semiconductor material.

14. The method of claim 13, further comprising removing said threshold adjusting semiconductor material selectively from said second active region prior to forming said first and second gate electrode structures.

15. The method of claim 11, wherein forming said recess and forming said threshold adjusting semiconductor material are performed as an in situ process sequence.

16. The method of claim 11, wherein forming said threshold adjusting semiconductor material comprises forming a silicon/germanium alloy.

17. The method of claim 11, wherein forming said isolation structure comprises forming a trench in said threshold adjusting semiconductor material and said semiconductor layer and filling said trench with an insulating material.

18. The method of claim 17, wherein forming said trench comprises exposing a portion of a buried insulating layer below said semiconductor layer.

19. The method of claim 11, further comprising forming a mask layer above said threshold adjusting semiconductor material in said first and second areas and forming said isolation structure in the presence of said mask layer.

20. The method of claim 19, wherein forming said mask layer comprises forming a first mask layer comprising a first material above said threshold adjusting semiconductor material and forming a second mask layer comprising a second mask material that is different than said first mask material above said first mask layer.

21. The method of claim 1, wherein forming said isolation structure comprises forming said isolation structure to extend to a buried insulating layer below said semiconductor layer.

22. A method, comprising:
forming a layer of threshold adjusting semiconductor alloy above a semiconductor layer of a semiconductor device;
forming a mask layer above said layer of threshold adjusting semiconductor alloy, said mask layer comprising a first mask material and a second mask material formed above said first mask material;
forming a trench in said mask layer, said layer of threshold adjusting semiconductor alloy and said semiconductor layer;
filling said trench with an insulating material to form an isolation structure therein, said isolation structure laterally separating a first active region and a second active region;
removing said layer of threshold adjusting semiconductor alloy selectively from said second active region; and
forming a first gate electrode structure of a first transistor on said layer of a semiconductor alloy of said first active region and forming a second gate electrode structure of a second transistor on said second active region, said first and second gate electrode structures each comprising a high-k dielectric gate insulation layer and a metal-containing gate electrode material.

23. The method of claim 22, wherein removing said layer of threshold adjusting semiconductor alloy selectively from said second active region comprises selectively removing at least said first mask material from above said second active region to expose a portion of said layer of threshold adjusting semiconductor alloy formed therein.

24. The method of claim 22, wherein removing said layer of threshold adjusting semiconductor alloy selectively from said second active region comprises removing said second mask material from above said first active region to expose said first mask material formed therein.

* * * * *